United States Patent
Chen

(10) Patent No.: US 9,673,334 B2
(45) Date of Patent: Jun. 6, 2017

(54) LOW TEMPERATURE POLY SILICON THIN FILM TRANSISTORS (LTPS TFTS) AND TFT SUBSTRATES

(71) Applicant: Shenzhen China Star Optoelectronics Technology Co., Ltd., Shenzhen, Guangdong (CN)

(72) Inventor: Chiu-chuan Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 181 days.

(21) Appl. No.: 14/433,650

(22) PCT Filed: Jan. 12, 2015

(86) PCT No.: PCT/CN2015/070520
§ 371 (c)(1),
(2) Date: Apr. 4, 2015

(87) PCT Pub. No.: WO2016/106825
PCT Pub. Date: Jul. 7, 2016

(65) Prior Publication Data
US 2016/0343876 A1  Nov. 24, 2016

(30) Foreign Application Priority Data
Dec. 31, 2014  (CN) .......................... 2014 1 0856640

(51) Int. Cl.
*H01L 29/786* (2006.01)
*G09G 3/36* (2006.01)
(Continued)

(52) U.S. Cl.
CPC ..... *H01L 29/78678* (2013.01); *G09G 3/3614* (2013.01); *G09G 3/3696* (2013.01);
(Continued)

(58) Field of Classification Search
CPC . H01L 29/786; H01L 27/1222; H01L 27/124; H01L 29/42356; H01L 29/42384;
(Continued)

(56) References Cited

U.S. PATENT DOCUMENTS 9,166,052 B1 * 10/2015 Ler .................. H01L 27/0629
2010/0047975 A1 * 2/2010 Yeh .................. H01L 27/1214
438/166

(Continued)

*Primary Examiner* — Nelson Rosario
(74) *Attorney, Agent, or Firm* — Andrew C. Cheng

(57) ABSTRACT

A LTPS TFT and a TFT substrate are disclosed. The LTPS TFT includes: a substrate; a first gate arranged on the substrate; a polysilicon layer arranged on the substrates, and the polysilicon layer covers the first gate, wherein the polysilicon layer comprises a source area, a drain area, and a trench area formed between the source area and the drain area; a second gate arranged on the polysilicon layer; wherein when the LTPS TFT has been driven, the first gate and the second gate are respectively applied with a first voltage and a second voltage, and a polarity of the first voltage is opposite to the polarity of the second voltage. In this way, the feed through voltage may be reduced such that the TFT performance is enhanced.

7 Claims, 3 Drawing Sheets

(51) Int. Cl.
 *H01L 27/12* (2006.01)
 *H01L 29/423* (2006.01)
(52) U.S. Cl.
 CPC ........ *H01L 27/124* (2013.01); *H01L 27/1222* (2013.01); *H01L 29/42356* (2013.01); *H01L 29/42384* (2013.01); *H01L 29/786* (2013.01); *H01L 29/78648* (2013.01); *G09G 3/3677* (2013.01); *G09G 2300/0417* (2013.01); *G09G 2300/0876* (2013.01); *G09G 2310/0205* (2013.01); *G09G 2310/08* (2013.01); *G09G 2320/0214* (2013.01)
(58) Field of Classification Search
 CPC ........ H01L 29/78648; H01L 29/78678; G09G 3/3614; G09G 3/3696; G09G 2300/0417; G09G 2300/0876; G09G 2310/0205; G09G 2310/08; G09G 2320/0214; G09G 3/3677
 See application file for complete search history.

(56) References Cited

U.S. PATENT DOCUMENTS

2010/0171186 A1\* 7/2010 Xiao ................. H01L 21/82381
 257/408
2015/0379923 A1\* 12/2015 Lee ...................... G09G 3/3233
 345/206

\* cited by examiner

LOW TEMPERATURE POLY SILICON THIN FILM TRANSISTORS (LTPS TFTS) AND TFT SUBSTRATES

BACKGROUND OF THE INVENTION

1. Field of the Invention

The present disclosure relates to liquid crystal display technology, and more particularly to LTPS TFTs and TFT substrates.

2. Discussion of the Related Art

LTPS TFT Liquid Crystal Displays (LCDs) are characterized by attributes such as high resolution rate, short response time, high brightness, and high aperture rate. In addition, silicon crystalline arrangement of the LTPS TFT has a specific sequence and mobility of the electrodes is relatively high. External driving circuit may be manufactured on the glass substrate so as to save the space and to reduce the cost of the driving IC.

With respect to conventional LTPS TFT, in order to prevent the leakage current caused by the photo current within the conductive channel, usually, a metallic layer is plated above the glass substrate to operate as a light shielding layer.

However, the masking effect of the light shielding layer is limited, and may cause the feed through voltage of the gate when the light shielding layer and other conductive layers have generated parasitic capacitance.

SUMMARY

According to the present disclosure, the LTPS TFT and the TFT substrate may reduce the Feed through voltage to enhance TFT performance.

In one aspect, a low temperature poly silicon thin film transistor (LTPS TFT) includes: a substrate; a first gate arranged on the substrate; a polysilicon layer arranged on the substrates, and the polysilicon layer covers the first gate, wherein the polysilicon layer comprises a source area, a drain area, and a trench area formed between the source area and the drain area; a second gate arranged on the polysilicon layer; wherein when the LTPS TFT has been driven, the first gate and the second gate are respectively applied with a first voltage and a second voltage, and a polarity of the first voltage is opposite to the polarity of the second voltage.

Wherein the first gate, the trench area, and the second gate are at least partially overlapped, respectively.

Wherein the LTPS TFT further includes: a gate insulation layer covering the polysilicon layer and the second gate; a source being arranged above the gate insulation layer, and the source connects to the source area via a first through hole arranged within the gate insulation layer; and a drain being arranged on the gate insulation layer, and the drain connects to the drain area via a second through hole arranged within the gate insulation layer.

Wherein the LTPS TFT further includes: a passivation layer covering the gate insulation layer, the source, and the drain;

wherein the passivation layer comprises a third through hole, when the passivation layer comprises at least one pixel electrode arranged thereon, the pixel electrode connects to the drain via the third through hole.

In another aspect, a thin film transistor (TFT) substrate includes: a substrate and a plurality of pixels arranged on the substrate, the pixels are arranged in a matrix, and each of the pixels respectively comprises the LTPS TFT and one pixel electrode electrically connecting to the LTPS TFT, wherein the LTPS TFT includes: a first gate arranged on the substrate; a polysilicon layer arranged on the substrates, and the polysilicon layer covers the first gate, wherein the polysilicon layer comprises a source area, a drain area, and a trench area formed between the source area and the drain area; a second gate arranged on the polysilicon layer; wherein when the LTPS TFT has been driven, the first gate and the second gate are respectively applied with a first voltage and a second voltage, and a polarity of the first voltage is opposite to the polarity of the second voltage.

Wherein the first gate, the trench area, and the second gate are at least partial overlapped, respectively.

Wherein the LTPS TFT further includes: a gate insulation layer covering the polysilicon layer and the second gate; a source arranged being arranged above the gate insulation layer, and the source connects to the source area via a first through hole arranged within the gate insulation layer; a drain being arranged on the gate insulation layer, and the drain connects to the drain area via a second through hole arranged within the gate insulation layer; a passivation layer covering the gate insulation layer, the source, and the drain; wherein the passivation layer comprises a third through hole, when the passivation layer comprises at least one pixel electrode arranged thereon, the pixel electrode connects to the drain via the third through hole.

Wherein the TFT substrate further includes: a plurality of first scanning lines, wherein the first gate of the LTPS TFT of each pixel respectively connects to one corresponding first scanning line so as to provide the first voltage to the first gate via the first scanning line; a plurality of second scanning lines, wherein the second gate of the LTPS TFT of each pixel respectively connects to one corresponding second scanning line so as to provide the second voltage to the second gate via the second scanning line; and a plurality of data lines, wherein the source of the LTPS TFT of each pixel respectively connects to one corresponding data line so as to provide a data voltage to the pixel electrodes via the data line and the turned on LTPS TFT when the LTPS TFT is turned on.

Wherein the first scanning line and the first gate of the LTPS TFT are respectively arranged on the same layer, and the second scanning line and the second gate of the LTPS TFT are respectively arranged on the same layer.

Wherein the TFT substrate further comprises a gate driver having a plurality of gate driving units, each of the gate driving units electrically connects to the first scanning line and the second scanning line respectively to drive the LTPS TFTs arranged on the same column, and each of the gate driving units comprise: a first switch component comprising a control end, an input end, and an output end, wherein the control end electrically connects with clock signals, the input end electrically connects with the input end of the gate driving unit to receive the gate driving signals, the output end operating as a first output end of the gate driving unit, the output end electrically connects to the second scanning line to output the second voltage to the second scanning line; an inverter, includes: a second switch component comprising a control end, an input end, and an output end, wherein the control end electrically connects to an input end of the gate driving unit to receive gate driving signals, the input end electrically connects to a first voltage source; a third switch component comprising a control end, an input end, and an output end, the control end electrically connects to the input end of the gate driving unit to receive the gate driving signals, and the input end electrically connects to a second voltage source; and wherein the output ends of the second switch component and the third switch component are electrically connected to operate as the second output end of the gate driving unit, and the second output end electrically connects to the first scanning line to output the first voltage to the first scanning line.

Wherein the second switch component is a p-type transistor, and the third switch component is a n-type transistor, a voltage provided by the second voltage source comprises an opposed polarity with pulse signals of the gate driving signals inputted by the input end of the gate driving unit.

In view of the above, the LTPS TFT includes: a substrate; a first gate arranged on the substrate; a polysilicon layer arranged on the substrates, and the polysilicon layer covers the first gate, wherein the polysilicon layer comprises a source area, a drain area, and a trench area formed between the source area and the drain area; a second gate arranged on the polysilicon layer; wherein when the LTPS TFT has been driven, the first gate and the second gate are respectively applied with a first voltage and a second voltage, and a polarity of the first voltage is opposite to the polarity of the second voltage. In this way, the feed through voltage may be reduced such that the TFT performance is enhanced.

DETAILED DESCRIPTION OF THE EMBODIMENTS

Embodiments of the invention will now be described more fully hereinafter with reference to the accompanying drawings, in which embodiments of the invention are shown.

Figure 1:
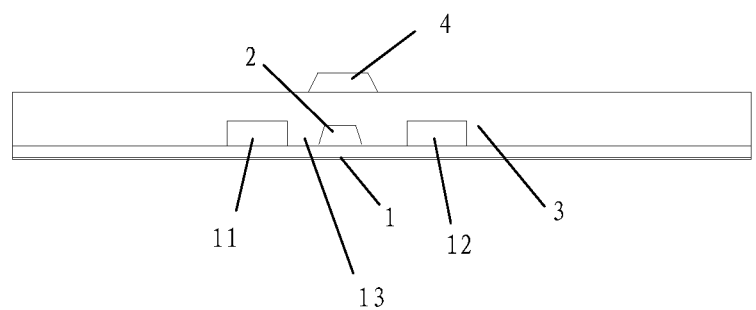
FIG. 1 is a schematic view of the LTPS TFT in accordance with one embodiment.

FIG. 1 is a schematic view of the LTPS TFT in accordance with one embodiment. The LTPS TFT includes a substrate 1, a first gate 2, a polysilicon layer 3, and a second gate 4. The first gate 2 is arranged on the substrate 1. The polysilicon layer 3 is arranged on the substrate 1, and the polysilicon layer 3 covers the first gate 2. The polysilicon layer 3 includes a source area 11, a drain area 12, and a trench area 13 formed between the source area 11 and the drain area 12. The second gate 4 is formed on the polysilicon layer 3.

When the LTPS TFT has been driven, the first gate 2 and the second gate 4 are respectively applied with a first voltage and a second voltage, and the polarity of the first voltage is opposite to that of the second voltage.

As the LTPS TFT includes the first gate 2 and the second gate 4, the applied first voltage and the second voltage respectively toward the first gate 2 and the second gate 4 may greatly reduce the feed through voltage and thus the TFT performance is enhanced. When the driving voltage of the LTPS TFT is the same, as the positive voltage applied to the gate is relatively small comparing to the LTPS TFT having only one gate, and thus the width of the gate circuit applying the positive voltage may be reduced so as to enhance the aperture rate and the resolution rate. The gate applying the negative voltage may be the light shielding layer at the same time, and thus the masking effect remains the same. The LTPS TFT may be manufactured by general manufacturing process and devices, and thus additional investment is not needed.

In an example, the lowest turn-on voltage of the LTPS TFT may be 8V. When there is only one gate, the voltage applied to the gate is 10V. Due to the impact of the feed through voltage, the real turn-on voltage of the LTPS TFT is just 8V. That is, the feed through voltage is 2V. In the embodiment, the LTPS TFT includes two gates. In an example, when the voltage applied by one LTPS TFT is 5V, the feed through voltage is 1V and the voltage applied by the other LTPS TFT is −5V. As such, the real turn-on voltage of the LTPS TFT equals to 5V−1V−(−5V), that is, 9V. In this way, the feed through voltage may be greatly reduced so as to enhance the TFT performance.

At least a portion of the first gate 2, the common electrode 13, and the second gate 4 are respectively overlapped. In one embodiment, the first gate 2, the trench area 13, and the second gate 4 may be completely or partially overlapped, respectively. When the first gate 2, the common electrode 13, and the second gate 4 are fully overlapped, the first gate 2 and/or the second gate 4 may exceed the trench area 13.

Figure 2:
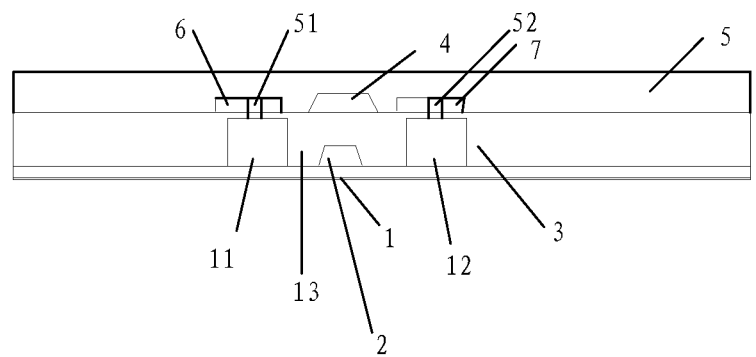
FIG. 2 is a schematic view of the LTPS TFT in accordance with another embodiment.

FIG. 2 is a schematic view of the LTPS TFT in accordance with another embodiment. The LTPS TFT further includes a gate insulation layer 5, a source 6, and a drain 7. The gate insulation layer 5 covers the polysilicon layer 3 and the second gate 4. The source 6 is arranged above the gate insulation layer 5. In addition, the source 6 connects to the source area 11 via a first through hole 51 arranged within the gate insulation layer 5. The drain 7 is arranged on the gate insulation layer 5, and the drain 7 connects to the drain area 12 via a second through hole 52 arranged within the gate insulation layer 5.

Figure 3:
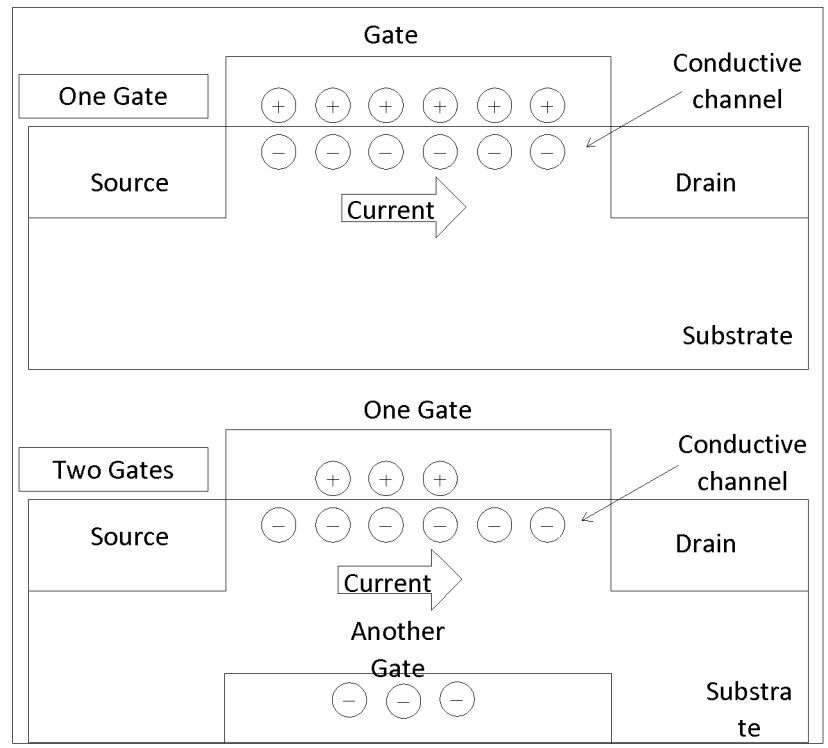
FIG. 3 is a schematic view of the LTPS TFT in accordance with one embodiment and one conventional gate.

FIG. 3 is a schematic view of the LTPS TFT in accordance with one embodiment and one conventional gate. It can be seen that when the driving circuit of the LTPS TFT is the same, the positive voltage applied by the gate is smaller than that when there is only one gate in the conventional LTPS TFT. For instance, when there is only one gate, the positive voltage applied to the gate is 10V. Comparing to the scenario with only one gate, the positive voltage applied to one of the gate may be 5V.

According to the present disclosure, one TFT substrate includes a substrate and a plurality of pixels arranged on the substrate. The pixels are arranged in a matrix, and each of the pixels respectively includes the LTPS TFT and one pixel electrode electrically connecting to the LTPS TFT. Referring to FIG. 1, Referring to FIG. 1, the LTPS TFT includes a substrate 1, a first gate 2, a polysilicon layer 3, and a second gate 4. The first gate 2 is arranged on the substrate 1. The polysilicon layer 3 is arranged on the substrate 1, and the polysilicon layer 3 covers the first gate 2.

The polysilicon layer 3 includes a source area 11, a drain area 12, and a trench area 13 formed between the source area 11 and the drain area 12. The second gate 4 is formed on the polysilicon layer 3. When the LTPS TFT has been driven, the first gate 2 and the second gate 4 are respectively applied with the first voltage and the second voltage, and the polarity of the first voltage is opposite to that of the second voltage.

The LTPS TFT includes the first gate 2 and the second gate 4. When the LTPS TFT has been driven, the first gate 2 and the second gate 4 are applied with the first voltage and the second voltage, and the polarity of the first voltage is opposite to that of the second voltage. As such, the feed through voltage is greatly reduced so as to enhance the TFT performance. When the driving voltage of the LTPS TFT is the same, as the positive voltage applied to the gate is relatively small comparing to the LTPS TFT having only one gate, and thus the width of the gate circuit applying the positive voltage may be reduced so as to enhance the aperture rate and the resolution rate. The gate applying the negative voltage may be the light shielding layer at the same time, and thus the masking effect remains the same. The LTPS TFT may be manufactured by general manufacturing process and devices, and thus additional investment is not needed.

At least a portion of the first gate 2, the common electrode 13, and the second gate 4 are respectively overlapped. In one embodiment, the first gate 2, the common electrode 13, and the second gate 4 may be at least partially or completely overlapped, respectively. When the first gate 2, the common electrode 13, and the second gate 4 are fully overlapped, the first gate 2 and/or the second gate 4 may exceed the trench area 13.

Figure 4:
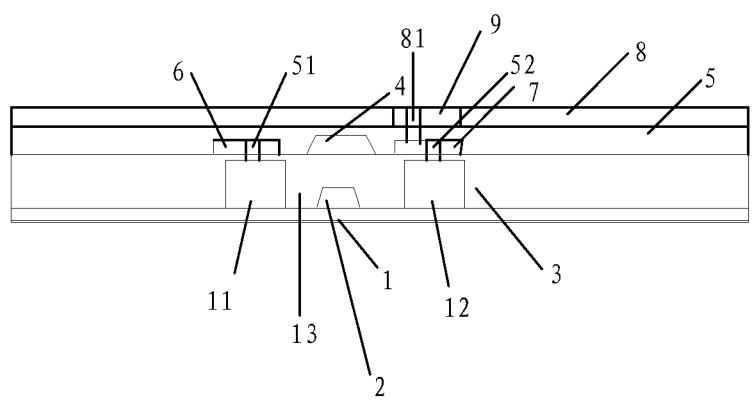
FIG. 4 is a schematic view of the LTPS TFT of one TFT substrate in accordance with one embodiment.

Referring to FIG. 4, the LTPS TFT further includes a gate insulation layer 5, a source 6, a drain 7, and a passivation layer 8. The gate insulation layer 5 covers the polysilicon layer 3 and the second gate 4. The source 6 is arranged above the gate insulation layer 5. In addition, the source 6 connects to the source area 11 via a first through hole 51 arranged within the gate insulation layer 5. The drain 7 is arranged on the gate insulation layer 5, and the drain 7 connects to the drain area 12 via a second through hole 52 arranged within the gate insulation layer 5. The passivation layer 8 covers the gate insulation layer 5, the source 6, and the drain 7. The pixel electrode 9 is arranged above the passivation layer 8 and the pixel electrode 9 connects to the drain 7 via a third through hole 81 arranged within the passivation layer 8.

The TFT substrate further includes a plurality of first scanning lines, a plurality of second scanning lines, and a plurality of data lines.

The first gate of the LTPS TFT of each pixel respectively connects to one corresponding first scanning line so as to provide the first voltage to the first gate via the first scanning line. The second gate of the LTPS TFT of each pixel respectively connects to one corresponding second scanning line so as to provide the second voltage to the second gate via the second scanning line. The source of the LTPS TFT of each pixel respectively connects to one corresponding data line so as to provide the data voltage to the pixel electrodes via the data line and the turned on LTPS TFT when the LTPS TFT is turned on.

The first scanning line and the first gate of the LTPS TFT are arranged on the same layer. The second scanning line and the second gate of the LTPS TFT are arranged on the same layer. The integrated way may be accomplished in this way so as to save the space.

The TFT substrate further includes a gate driver having a plurality of gate driving units. Each of the gate driving units electrically connects to the first scanning line and the second scanning line respectively to drive the LTPS TFTs arranged on the same column.

Figure 5:
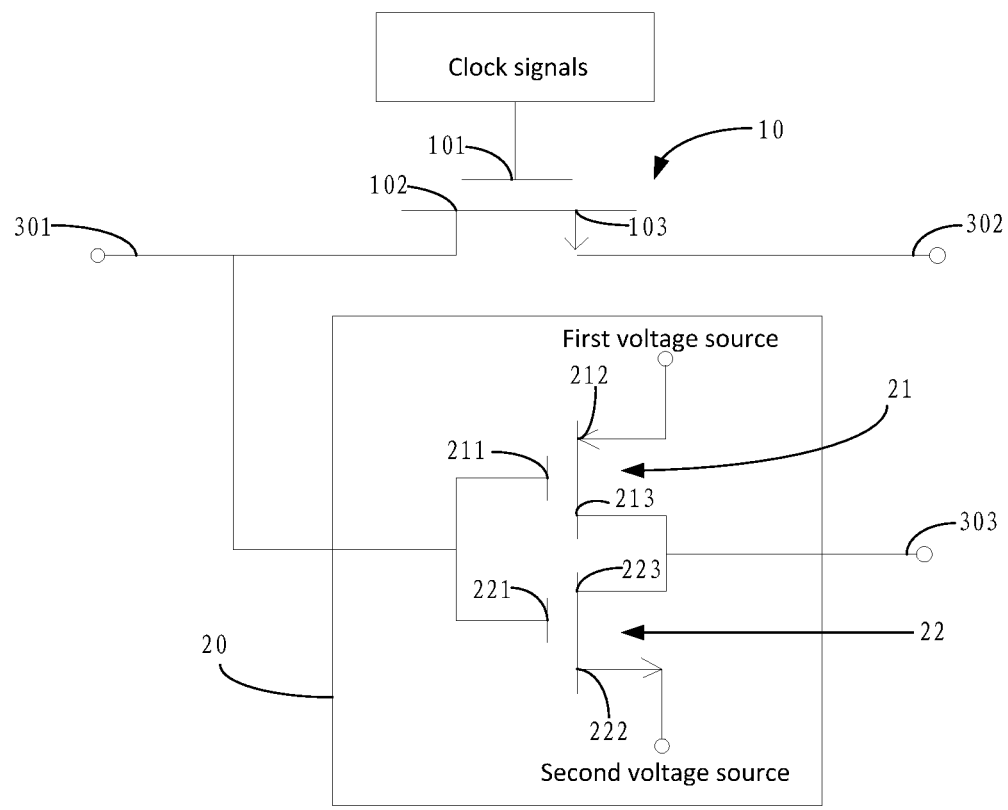
FIG. 5 is a schematic view of the LTPS TFT of one TFT substrate in accordance with another embodiment.

Referring to FIG. 5, each gate driving unit respectively includes a first switch component 10 and an inverter 20.

The first switch component 10 includes a control end 101, an input end 102, and an output end 103. The control end 101 electrically connects with clock signals. The input end 102 electrically connects with the input end 301 of the gate driving unit to receive the gate driving signals. The output end 103 operates as a first input end 302 of the gate driving unit. The first input end 302 electrically connects to the second scanning line to output the second voltage to the second scanning line.

The inverter 20 may include a second switch component 21 and a third switch component 22. The Gate on Array (GOA) technology is adopted to arrange the inverter in a rim circuit area.

The second switch component 21 includes a control end 211, an input end 212, and an output end 213. The control end 211 electrically connects to an input end 301 of the gate driving unit to receive gate driving signals. The input end 212 electrically connects to the first voltage source. The third switch component 22 includes a control end 221, an input end 222, and an output end 223. The control end 221 electrically connects to the input end 301 of the gate driving unit to receive the gate driving signals. The input end 222 electrically connects to the second voltage source. The output ends 213, 223 of the second switch component 21 and the third switch component 22 are electrically connected to operate as the second output end 303 of the gate driving unit, which electrically connects to the first scanning line to output the first voltage to the first scanning line.

The inverter may inverse the phase of the input signals for 180 degrees. In other embodiments, other inventers may be adopted.

The second switch component 21 is a p-type transistor, and the third switch component 22 is a n-type transistor. The voltage provided by the second voltage source has an opposed polarity with pulse signals of the gate driving signals inputted by the input end 301 of the gate driving unit.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:
1. A low temperature poly silicon thin film transistor (LTPS TFT), comprising:
    a substrate;
    a first gate arranged on the substrate;
    a polysilicon layer arranged on the substrates, wherein the polysilicon layer covers the first gate, and the polysilicon layer comprises a source area, a drain area, and a trench area formed between the source area and the drain area;
    a second gate arranged on the polysilicon layer;
    wherein when the LTPS TFT has been driven, the first gate and the second gate are respectively applied with a first voltage and a second voltage, and a polarity of the first voltage is opposite to the polarity of the second voltage;
    wherein the first gate, the trench area, and the second gate are at least partially overlapped, respectively;
    wherein the LTPS TFT further comprising:
    a gate insulation layer covering the polysilicon layer and the second gate;
    a source being arranged above the gate insulation layer, and the source connects to the source area via a first through hole arranged within the gate insulation layer; and
    a drain being arranged on the gate insulation layer, and the drain connects to the drain area via a second through hole arranged within the gate insulation layer.
2. The LTPS TFT as claimed in claim 1, wherein the LTPS TFT further comprises:
    a passivation layer covering the gate insulation layer, the source, and the drain;

wherein the passivation layer comprises a third through hole, when the passivation layer comprises at least one pixel electrode arranged thereon, the pixel electrode connects to the drain via the third through hole.

3. A thin film transistor (TFT) substrate, comprising:
a substrate and a plurality of pixels arranged on the substrate, the pixels are arranged in a matrix, and each of the pixels respectively comprises the LTPS TFT and one pixel electrode electrically connecting to the LTPS TFT, wherein the LTPS TFT comprises:
a first gate arranged on the substrate;
a polysilicon layer arranged on the substrates, and the polysilicon layer covers the first gate, wherein the polysilicon layer comprises a source area, a drain area, and a trench area formed between the source area and the drain area;
a second gate arranged on the polysilicon layer;
wherein when the LTPS TFT has been driven, the first gate and the second gate are respectively applied with a first voltage and a second voltage, and a polarity of the first voltage is opposite to the polarity of the second voltage;
wherein the first gate, the trench area, and the second gate are at least partial overlapped, respectively;
wherein the LTPS TFT further comprising:
a gate insulation layer covering the polysilicon layer and the second gate;
a source arranged being arranged above the gate insulation layer, and the source connects to the source area via a first through hole arranged within the gate insulation layer;
a drain being arranged on the gate insulation layer, and the drain connects to the drain area via a second through hole arranged within the gate insulation layer;
a passivation layer covering the gate insulation layer, the source, and the drain;
wherein the passivation layer comprises a third through hole, when the passivation layer comprises at least one pixel electrode arranged thereon, the pixel electrode connects to the drain via the third through hole.

4. The TFT substrate as claimed in claim 3, wherein the TFT substrate further comprises:
a plurality of first scanning lines, wherein the first gate of the LTPS TFT of each pixel respectively connects to one corresponding first scanning line so as to provide the first voltage to the first gate via the first scanning line;
a plurality of second scanning lines, wherein the second gate of the LTPS TFT of each pixel respectively connects to one corresponding second scanning line so as to provide the second voltage to the second gate via the second scanning line; and
a plurality of data lines, wherein the source of the LTPS TFT of each pixel respectively connects to one corresponding data line so as to provide a data voltage to the pixel electrodes via the data line and the turned on LTPS TFT when the LTPS TFT is turned on.

5. The TFT substrate as claimed in claim 4, wherein the first scanning line and the first gate of the LTPS TFT are respectively arranged on the same layer, and the second scanning line and the second gate of the LTPS TFT are respectively arranged on the same layer.

6. The TFT substrate as claimed in claim 4, wherein the TFT substrate further comprises a gate driver having a plurality of gate driving units, each of the gate driving units electrically connects to the first scanning line and the second scanning line respectively to drive the LTPS TFTs arranged on the same column, and each of the gate driving units comprise:
a first switch component comprising a control end, an input end, and an output end, wherein the control end electrically connects with clock signals, the input end electrically connects with the input end of the gate driving unit to receive the gate driving signals, the output end operating as a first output end of the gate driving unit, the output end electrically connects to the second scanning line to output the second voltage to the second scanning line;
an inverter, comprises:
a second switch component comprising a control end, an input end, and an output end, wherein the control end electrically connects to an input end of the gate driving unit to receive gate driving signals, the input end electrically connects to a first voltage source;
a third switch component comprising a control end, an input end, and an output end, the control end electrically connects to the input end of the gate driving unit to receive the gate driving signals, and the input end electrically connects to a second voltage source; and
wherein the output ends of the second switch component and the third switch component are electrically connected to operate as the second output end of the gate driving unit, and the second output end electrically connects to the first scanning line to output the first voltage to the first scanning line.

7. The TFT substrate as claimed in claim 6, the second switch component is a p-type transistor, and the third switch component is a n-type transistor, a voltage provided by the second voltage source comprises an opposed polarity with pulse signals of the gate driving signals inputted by the input end of the gate driving unit.

* * * * *